United States Patent [19]

Ragless

[11] Patent Number: 5,069,726
[45] Date of Patent: Dec. 3, 1991

[54] CERAMIC COATED WIRES AND THERMOCOUPLES

[75] Inventor: Clive L. Ragless, Bedford Park, Australia

[73] Assignees: Industrial Pyrometers (Aust.) Pty Ltd., Richmond, Australia; The Commonwealth Scientific and Industrial Research Organisation, Campbell, Australia

[21] Appl. No.: 507,142

[22] Filed: Apr. 10, 1990

[30] Foreign Application Priority Data

Apr. 11, 1989 [AU] Australia ............................. PJ3625
Apr. 26, 1989 [AU] Australia ............................. PJ3896

[51] Int. Cl.⁵ ...................... H01L 35/34; H01L 37/00
[52] U.S. Cl. .................................. 136/201; 136/200; 136/233; 427/117
[58] Field of Search ............... 136/200, 201, 230, 231, 136/232, 233, 234, 242; 427/70, 71, 117

[56] References Cited

U.S. PATENT DOCUMENTS

| | | | |
|---|---|---|---|
| 2,504,764 | 4/1950 | Vollrath | 136/4 |
| 2,571,700 | 10/1951 | Ford | 136/4 |
| 2,757,220 | 7/1956 | Carter | 136/4 |
| 2,870,233 | 1/1959 | Comer | 136/4 |
| 3,010,480 | 11/1961 | Ragsdale | 138/89 |
| 3,353,260 | 11/1967 | Davis et al. | 29/573 |
| 3,449,174 | 6/1969 | Kleinle | 136/228 |
| 3,806,362 | 4/1974 | Reed et al. | 117/221 |
| 3,833,387 | 9/1974 | Reed et al. | 106/49 |
| 3,970,481 | 7/1976 | Stroik | 136/230 |
| 4,686,320 | 8/1987 | Novak et al. | 136/239 |

OTHER PUBLICATIONS

Bunshah, Rointan F. et al., *Deposition Technologies for Films and Coatings*, 1982, pp. 1-18.

Bunshah, R. F., "Two Vapor Coating Processes Cover the Field of Applications," *Research & Development*, Aug. 1989, pp. 73-78.

*Primary Examiner*—Brooks H. Hunt
*Assistant Examiner*—Chrisman D. Carroll
*Attorney, Agent, or Firm*—Wegner, Cantor, Mueller & Player

[57] ABSTRACT

An insulated ceramic coated wire with a relatively thin ceramic coating allowing flexibility. The insulation is non porous and is particularly useful for thermocouples. The application all describes thermocouple made with such wires.

12 Claims, 1 Drawing Sheet

CERAMIC COATED WIRES AND THERMOCOUPLES

This invention relates to wires with ceramic insulation with reference in particular to thermocouple wires and to thermocouples manufactured with such wires.

Insulation of wires for high temperature applications is difficult because most insulation materials do not have high temperature resistance and insulation materials which do have high temperature resistance are often fragile and inflexible or porous.

Thermocouple wires in particular have had problems with insulation. In the past insulation has generally been by ceramic blocks with apertures through which the wires pass supported in a sealed ceramic or metal tube. These blocks are subject to cracking if they are subject to mechanical shock and as the wire itself does not have a surface coating it can be contaminated which can cause inaccuracies to thermocouple readings. Rare metal thermocouples the more common being platinum based with traces of rodium are potentially more accurate and durable than base metal thermocouples particularly at temperatures above 1000 degrees centigrade. These thermocouple wires however are particularly subject to the problems discussed above and it is the object of this invention to provide a ceramic insulation on the wires and in particular on thermocouple wires which has high temperature resistance and is flexible and protects the wire from contamination.

Hence for thermocouples made with such wires it is the object of this invention to eliminate the requirement for separate ceramic insulators and to provide an impervious coating on each individual wire which will not effect the accuracy of the thermocouple but will protect the wire from contamination and provide electrical insulation. These insulated wires can then be inserted into a suitable sheath.

In one form therefore the invention is said to reside in a method of producing an electrically insulating coating on a wire comprising annealing the wire to stabilize the surface topography of the wire, depositing a layer of ceramic material on the surface of the wire, the ceramic material having a co-efficient of thermal expansion substantially similar to that of the wire, the deposition being carried out while the wire is at a temperature of between 200 (degrees centigrade) and 1400° C. (degrees centigrade), and heating the wire after deposition of the ceramic material for sufficient time for the layer of ceramic material to crystallize to form an impervious scratch resistance and flexible layer on the surface.

Preferably the wire is annealed by heating to a temperature of between 1000° C. (degrees centigrade) to 1400 (degrees centigrade) for a period of from 10 minutes to 1 hour.

The ceramic material may be selected from alumina or other composite ceramic materials.

The ceramic material may be deposited by a process selected from chemical vapour deposition, electron beam evaporation, physical vapour deposition, plasma assisted chemical vapour deposition or ion enhanced electron beam evaporation.

When deposited and heated the ceramic material may be in a crystalline layer on the wire of the thickness of 0.3 micrometers to 1.5 micrometers or may be thicker for some applications and other ceramic materials.

The wire may be a platinum based thermocouple wire or some other form of thermocouple wire such as chromel alumel or iron constantan, Nicrosil or Nisil.

In one preferred form the wire has a diameter of 0.35 mm.

The invention may also reside in a wire produced by the method as discussed above.

The invention may also reside in an insulated wire having a ceramic material insulating layer the wire being a platinum based thermocouple wire and having a diameter of 0.35 mm, the ceramic material being alumina in crystalline form having a thickness on the wire of from 0.3 to 1.5 micrometers.

In another form the invention may be said to reside in a thermocouple comprising a metal sheath, a packing of ceramic fibre within the sheath and two thermocouple wires extending to a thermocouple junction within the sheath, the thermocouple wires being coated with a ceramic material according to the method as discussed above.

In one form the wires within the sheath may be loosely spirally wound around each other in the sheath so as to allow for differential longitudinal thermal expansion between the wires and the sheath.

This then generally describes the invention but to more easily assist with understanding of the invention reference will now be made to examples for performing the method and the accompanying illustrations which show a thermocouple manufactured with the wires as produced by the method.

DETAILED DESCRIPTION OF THE INVENTION

Figure 1:
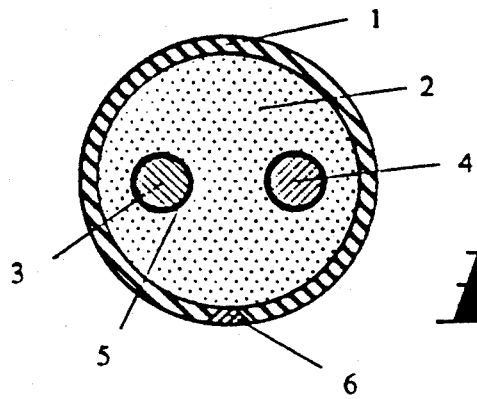
FIG. 1 shows a cross-sectional view of a thermocouple according to this invention.

First looking at the method of coating the wires the invention will be specifically discussed in relation to the coating of alumina onto platinum based thermocouple wires but it is to be realised that the invention is not limited to this form of the invention but may be used with other ceramics onto other wires for other purposes.

Wire diameters are dependant upon the application intended for the wire but with the insulation of the present invention in many cases thinner wires than otherwise possible may be used because of prevention of surface contamination. In preferred embodiment wire diameters may range from 0.1 mm to 1.0 mm for platinum based wires or larger for base metals wires. Commercial thermocouples based on platinum (Pt) are often referred to as types B, S and R with each consisting of two Pt-based thermoelement wires. The two wires of the type B thermocouple are Pt 30%Rh and Pt 6%Rh, those of the type S are Pt 10%Rh and Pt and the type R consists of Pt 13%Rh and Pt (in each case their percentage is weight %).

Of the various insulating materials that could be applied as a coating on platinum-based thermocouple wires, either singly or in combination as a multiple layer, the preferred choice is alumina, $Al_2O_3$. It is an electrical insulator and is chemically compatible with platinum-based alloys.

For many years re-crystallized $Al_2O_3$ has been the preferred ceramic material for use in the form of multi-bore rods to contain, separate and electrically insulate Pt-based thermocouple wires from each other. It also prevents Pt, Rh and their oxides from migrating from one wire to the other in the vapour phase. $Al_2O_3$ is the only ceramic recommended for use with Pt-based thermocouples in their most accurate role: as calibration standards. Thus, the preferred coating layer in direct contact with Pt-based thermocouple wires is $Al_2O_3$.

To demonstrate the viability of thin-film ceramic coatings for Pt-based alloys the most difficult and the most demanding application is considered for the study outlined below, vis; when a single layer is used to achieve all the properties required of a thermocouple coating. Then it needs to be shown that such a film has the following properties:

1. good adhesion to the metal so that the coting does not separate when bent or otherwise disturbed,
2. good flexibility to allow bending without damage, e.g., in normal handling or when winding the coated wire onto storage spools,
3. scratch resistant so that sever handling and use in contact with solid ceramics does not affect the protection achieved by the coating,
4. able to withstand heating to temperatures above 1000° C., and
5. low porosity to minimise penetration of contaminants in applications where this is a problem.

The temperature of at least part of a platinum based thermocouple is usually changed by as much as 1000° C. or so during use and the associated stress in the coating is minimised if the thermal expansion coefficient of the coating is similar to that of the underlying metal. This is the case for an alumina coating, its mean coefficient from 20° to 1000° C. is $9.5 \times 10^{-6} K^{-1}$ (reagent grade $Al_2O_3$) and compares well with that for platinum, $10.2 \times 10^{-6} K^{-1}$.

Alumina in solid form is brittle and relatively inflexible but in thin-film form it is suitable for the applications considered here. Thin films may be produced by a variety of known vacuum-based deposition techniques including chemical vapour deposition (CVD) and electron-beam evaporation (EBE): When substrate temperatures are below about 200° C. these methods need to be enhanced to avoid a low packing density, and thus the likelihood of high porosity as the films re-crystallize on heating to a high temperature. The enhancing techniques are known as plasma-assisted CVD and ion-assisted EBE, respectively.

To demonstrate that the five desirable film properties, listed above, are achievable with a single thin-film ceramic coating, alumina was deposited using an EBE technique. The EBE system using pellets of pure alumina was mounted in a 600 mm diameter Dynavac bell-jar vacuum plant and film thickness was monitored continually by an optical transmission technique.

During deposition 100 mm lengths of 0.35 mm diameter Pt 13 wt %Rh wire specimens, gripped at each end in metallic chucks, were electrically heated to the chosen substrate temperature (see Table 1) and continually rotated to give an even coating. The relationship between substrate temperature and the DC electric current used to achieve the temperature was pre-determined in vacuum using a calibrated optical pyrometer.

For a ceramic film to be stable the surface topography of the underlying metal needs to be stabilised. As-received PtRh thermocouple wires are in the as-drawn state and have several irregular surface features that change when used at high temperatures. For example, a typical as-drawn surface will have draw marks (scratchs) and cracks, typically $\sim 1$ μm across, and cavities of up to 10 μm in width/length. Moreover, the last draw would have obliterated surface features associated with the grain-boundary structure of the metal. On heating at temperatures above 1000° C. the PtRh surface flows laterally, the irregular features are reduced and the grain-boundary structure within the metal develops corresponding grooves at the surface. The grain-boundaries may be up to 100 μm apart and the grooves represent radial displacements at the surface of up to $\sim 2$ μm. In this study the wires specimens were stabilised by electrically annealing them at 1400° C. for 20 minutes before applying the coating. It is preferable to anneal for a period of from 10 minutes to 1 hour.

Preliminary work showed that at high temperatures $Al_2O_3$ films tend to develop needle-like crystals with diameters of 0.3 to 1 μm. Thus, as a severe test of the ability of films to form with a minimum of pores, the coating described below were deposited to a thickness of 0.3 to 0.5 μm. Then, if crystals separate or form clusters the presence of gaps or pores, revealing the metal surface below, will be evident: there being insufficient material to form more than one layer of crystals. The following test procedure was adopted for wires coated at various substrate temperatures up to 1400° C.:

one end of a $\sim 50$ mm length of coated wire was held under a grub screw in a specimen holder suitable for mounting in a scanning electron microscope (SEM), by pulling on the free end the wire was bent 180° around a 10 mm diameter clean vertical brass rod, on a straight horizontal section of coated wire a knife edge exerting a force of 20 g on the coating was wiped $\sim 10$ mm along it and the coating was examined in a SEM.

The SEM was a Jeol model JSM-35CF, the accelerating voltage for the electron beam was 15 kV and the coatings were examined and photographed at various magnifications. In this way the overall appearance of the coating (across the full wire diameter) could be assessed and detail down to 0.1 μm could be resolved. The results of these tests are given in Tables 1 and 2.

Lengths of coated wire were placed in twin-bore rods of alumina and heated for 65 hours at 1200° C. At various times they were removed for examination in the SEM and the results are grouped below according to substrate temperature used in the coating process:

Ambient: the coating was lost from $\sim 20\%$ of the area through handling and in 65 hours of heating about 40% of the coating changed to a continuous opaque phase having an elongated crystalline pattern. The coating was not affected by the grain-boundary grooves in the underlying metal.

200°-600° C.: the coatings were intact and the proportion of their areas that had changed to the opaque crystalline phase varied from 90% for sample B to 100% for sample D. Grain-boundary grooves caused some disturbance to the coatings, varying from occasional fine cracks in sample B to some separation of the needle-like crystals causing gaps up to $\sim 1$ μm in width for sample D. In some regions away from the grooves the otherwise continuous coatings formed scattered pores through crystal separation. The pore were up to ~1 μm across and their extent increased with substrate temperature, totaling about 2% in area for sample D.

1000°-1400° C.: the coatings were not affected by handling and from ~2% to ~10% of the as-coated, granular-like crystalline material, the extent increasing with substrate temperature, developed separated needle-like crystals. In each case the crystalline plates between the metal grain boundaries were separated over the grooves by an amorphous material up to ~1 μm in width. Scattered pores were also in evidence.

Films deposited at 200° to 600° C. and then crystallized by heating at 1200° C. have the best combination of properties such as adhesion, scratch resistance and continuity of film. In particular, sample D (600° C. substrate) has optimum scratch resistance, adhesion and flexibility and has only slight porosity. For applications requiring an even lower porosity the film thickness could be increased to ~1.5 μm, say, to give approximately 3 crystal layers. Alternatively for applications where a very thin film combined with a negligible porosity is needed the coating would be produced at a lower substrate temperature, e.g. 400° C. (see sample C), at the expense of reducing the resistance to scratching and sever bending.

TABLE 1

Substrate temperatures and appearance of 0.5 μm thick alumina coatings.

| Sample | Substrate Temperature | Appearance |
|---|---|---|
| A | ambient | smooth & continuous (amorphous) - not reflecting g.b.g. |
| B | 200° C. | smooth & continuous (amorphous) - not reflecting g.b.g. |
| C | 400 | smooth & continuous (amorphous) - slight impressions of g.b.g. |
| D | 600 | smooth & continuous (amorphous) - reflecting g.b.g. pattern |
| E | 1000 | fully coated: crystalline plates meeting along g.b.g. |
| F | 1100 | fully coated: crystalline plates meeting along g.b.g. |
| G | 1200 | fully coated: crystalline plates meeting along g.b.g. |
| H | 1400 | fully coated: crystalline plates meeting along g.b.g. | grain-boundary grooves in the metal substrate

TABLE 2

Mechanical tests on coatings

| Sample | Bend Test | Scratch Test |
|---|---|---|
| A | coating broken up | 70-100 μm strip of coating removed |
| B | coating broken up | ~20 μm strip damaged |
| C | coating cracked | 10-20 μm strip slightly damaged |
| D | no damage | 10-20 μm strip: superficial damage |
| E | no damage | ~15 μm mark: no damage |
| F | no damage | ~10 μm mark |
| G | no damage | ~10 μm mark |
| H | no damage | ~10 μm mark |

In manufacturing a single-layer coated wire thermocouple the as-drawn wire is first cleaned with solvents such as acetone or isopropyl alcohol, stabilised or annealed at a suitable temperature of 1400° C. for a period of 20 minutes, coated with the chosen ceramic to a depth of at least 0.5 μm and changed to a crystalline phase by heating to a temperature greater than 1100° C. For alumina films the preferred substrate temperature is in the range 300° to 700° C. The various parameters, such as time of heating, substrate temperature and deposition rate, depend on the deposition technique, the ceramic being deposited and on the intended application. The application dictates which of the 5 above-listed film properties are the more important and thus in need of enhancing.

The wire produced by the method above may be used for the manufacture of thermocouples or may be used in other applications where high temperature insulation is necessary. Such applications might include ovens, heating elements of various sorts or winding wires for high temperature electric motors.

As discussed earlier in each application the selection of a suitable ceramic material for coating on to the wire will be determined by the type of wire and the co-efficient of expansion of the wire so that the co-efficient of expansion of the ceramic material is substantially the same as that of the wire for the particular application.

Now looking at the drawings it can be seen that a thermocouple can be manufactured with advantageous properties using wires coating according to the method discussed above.

Figure 2:
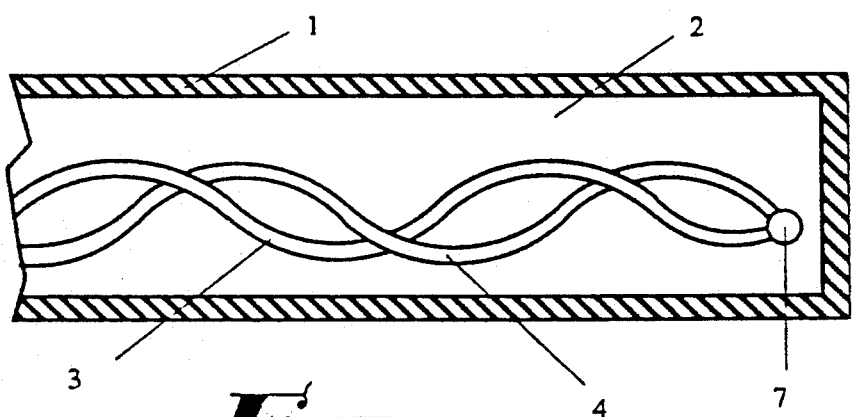
FIG. 2 shows a side cross-sectional view of a thermocouple according to this invention.

Now looking closely at the drawings it will be seen that in FIG. 1 and FIG. 2 which show cross-sectional and longitudinal section views of a thermocouple according to this invention there is a metal sheath 1 usually of a corrosion resistant material such as stainless steel. A packing material such as ceramic fibre is within the sheath and two thermocouple wires 3 and 4 extend longitudinally within the sheath mechanically supported by the packing slightly away from each other. Each wire 3 and 4 is of a different composition so that at a thermocouple junction 7 a Seebeck effect occurs and a potential difference is generated. Each wire 3 and 4 has a very thin ceramic coating 5 which is flexible and impervious. In this embodiment the metal sheath is formed by rolling and welding and the weld is shown at 6. Looking at FIG. 2 it will be seen that the wires 3 and 4 may be loosely spirally wound one around the other so that any differential thermal expansion between the material of the sheath 1 and materials of the wires 3 and 4 may be taken up by movement of the wires in the packing material 2.

Figure 3:
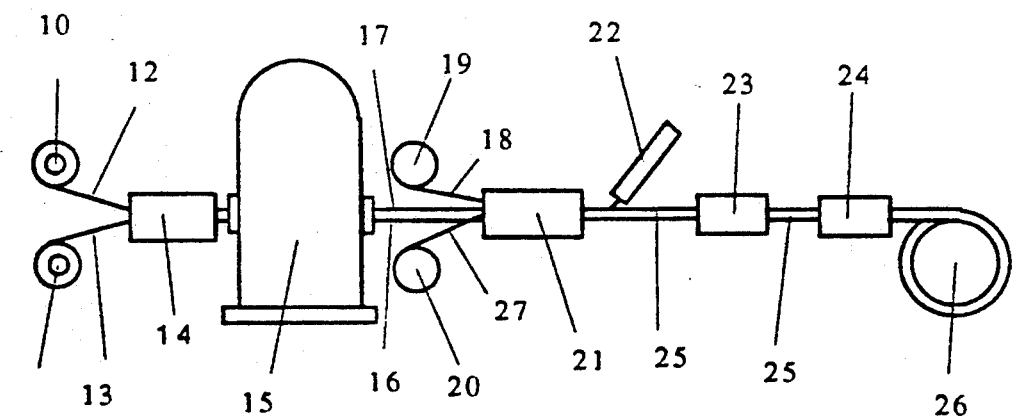
FIG. 3 shows one method of forming a thermocouple cable according to this invention.

FIG. 3 shows one method by which a continuous length of thermocouple device according to this invention may be manufactured.

Spools 10 and 11 have wires 12 and 13 drawn from them passing through a cleaning stage 14 before entering a ceramic coating stage 15. In the stage 15 which is only shown in a stylised form the wire is annealed and then heated and alumina or other ceramic material is deposited on the wire and the wire is then maintained at a heat at sufficient time for the ceramic coating to crystallize. The coated wires 16 and 17 then pass into a sheath forming stage in which they are wrapped in a fibre packing 27 which is unrolled from a spool 19 and then sheathed by a metal strip 18 which is unwound from a spool 20. The metal strip 19 in the stage 21 is rolled around the packing and wires and then welded by continuous sheath welder 22 to form a cylindrical sheath onto the thermocouple wires. Stage 23 has a post-forming die to form a cylindrical sheath and then the stage 24 cleans the sheath 25 before it is wound onto a spool 26.

By this means it will be seen that continuous a length of thermocouple device can be made.

When it is desired to manufacture a thermocouple of a particular length a length of sheath is cut off and the two wires within the sheath are welding together and a suitable sealing cap may be placed over the end.

It will be noted in particular that the wires according to this invention do not need to have mechanical strength as they are supported in the fibre material in the sheath and hence they may be considerably thinner than known thermocouple wires while still providing the same efficiencies. This will enable considerable reduction in costs.

We claim:

1. A method of providing an electrically insulating flexible adherent ceramic coating on a wire comprising annealing the wire to stabilize the surface topography of the wire, depositing a thin film layer of ceramic material by vacuum-based vapor deposition on the surface of the wire, the said ceramic material having a co-efficient of thermal expansion substantially similar to that of the wire, the deposition being carried out while the wire is at a temperature of between 200° C. and 1400° C., and heating the wire after deposition of the ceramic for sufficient time for the ceramic layer to crystallize to form an impervious scratch resistant, adherent and flexible layer on the surface of the wire, said layer being from about 0.3 micrometers to about 1.5 micrometers in thickness.

2. A method as in claim 1 wherein the wire is annealed by heating to a temperature of between 1000° C. to 1400° C. for a period of from 10 minutes to 1 hour.

3. A method as in claim 1 wherein the ceramic material is selected from alumina or composite ceramic materials.

4. A method as in claim 1 wherein the ceramic material is deposited by a process selected from chemical vapour deposition, electron beam evaporation, physical vapour deposition, plasma assisted chemical vapour deposition or ion enhanced electron beam evaporation.

5. A method as in claim 1 wherein the wire has a diameter of 0.1 mm to 1.0 mm.

6. A method as in claim 1 wherein the wire is a thermocouple wire.

7. A method as in claim 1 wherein the wire is a platinum based thermocouple wire.

8. A thermocouple wire comprising a wire selected from type B, type S and type R platinum based thermocouple wires (as hereinbefore defined) or Chromel Alumel, Nicrosil, Nisil, or Iron constantan and coated with a ceramic material by the method claim 1, said ceramic material having a thickness on the wire of from 0.3 to 1.5 micrometers.

9. An insulated wire having a ceramic material insulating layer, the wire being a platinum based thermocouple wire and having a diameter of 0.35 mm, the ceramic material being alumina in crystalline form and having a thickness on the wire of from 0.3 to 1.5 micrometres.

10. A thermocouple comprising a metal sheath, a packing of ceramic fibre within the sheath and two thermocouple wires extending to a thermocouple junction within the sheat, the thermocouple wires being coated with a ceramic material according to the method of claim 1, said ceramic material having a thickness on the wire of from 0.3 to 1.5 micrometers.

11. A thermocouple as in claim 10 wherein the wires are loosely spirally wound around each other in the sheath so as to allow for differential thermal expansion between the wires and the sheath.

12. A method as in claim 1 wherein the wire is platinum based wire and the ceramic material is alumina.

* * * * *

UNITED STATES PATENT AND TRADEMARK OFFICE
CERTIFICATE OF CORRECTION

PATENT NO. : 5,069,726

DATED : December 3, 1991

INVENTOR(S) : Clive L. RAGLESS et al.

It is certified that error appears in the above-identified patent and that said Letters Patent is hereby corrected as shown below:

On the title page, in item [75] Inventor: please change the inventorship to read as follows:

-- Inventor: Clive L. Ragless, Bedford Park, Australia
            Robin E. Bentley, Mona Vale, Australia --

Signed and Sealed this

Twenty-fifth Day of May, 1993

*Attest:*

MICHAEL K. KIRK

*Attesting Officer*     *Acting Commissioner of Patents and Trademarks*